United States Patent [19]
Holden

[11] Patent Number: 6,113,646
[45] Date of Patent: Sep. 5, 2000

[54] METHOD OF SELECTING LAYOUT OF INTEGRATED CIRCUIT PROBE CARD

[75] Inventor: Blane Holden, Boise, Id.

[73] Assignee: Micron Technology, Inc., Boise, Id.

[21] Appl. No.: 08/984,726

[22] Filed: Dec. 4, 1997

[51] Int. Cl.[7] .................................................. G01R 31/02
[52] U.S. Cl. ........................................................ 716/4
[58] Field of Search .............................. 324/158.1, 754, 324/756; 716/4

[56] References Cited

U.S. PATENT DOCUMENTS

| | | | |
|---|---|---|---|
| 5,491,427 | 2/1996 | Ueno | 324/754 |
| 5,736,850 | 4/1998 | Legal | 324/158.1 |
| 5,806,181 | 9/1998 | Khandros | 324/756 |

*Primary Examiner*—Paul R. Lintz
*Assistant Examiner*—Thuan Do
*Attorney, Agent, or Firm*—Schwegman, Lundberg, Woessner & Kluth, P.A.

[57] ABSTRACT

A probe card design method is described which optimizes the number of die probed per touchdown and minimizes the number of steps required to test an integrated circuit wafer. The method analyses rows of a wafer in sets. Assuming a specific probe card matrix, the number of touchdown steps required for each set is determined and a total number of touchdown steps required for the wafer is determined. This method is repeated for a plurality of probe card matrixes. The size of the first set can be varied to determine an optimum offset which reduces the number of touchdown steps required to test the wafer. Each set is analyzed by dividing the longest row of the set by the width of the probe card matrix and rounding a result up to the nearest integer. The result of each set is summarized to indicate a minimum number of touchdowns required to test a wafer. A probe card matrix design can be selected based upon the minimum number of touchdowns, number of test sites in a probe card matrix, and a physical size of the matrixes.

15 Claims, 7 Drawing Sheets

METHOD OF SELECTING LAYOUT OF INTEGRATED CIRCUIT PROBE CARD

TECHNICAL FIELD OF THE INVENTION

The present invention relates generally to equipment for testing integrated circuit and in particular the present invention relates to integrated circuit probe cards for testing a wafer of integrated circuits.

BACKGROUND OF THE INVENTION

Integrated circuits are typically fabricated as individual die which can be packaged. The integrated circuit die is fabricated from a wafer of silicon, or other suitable material, such that hundreds, or perhaps thousands, of individual die are simultaneously processed on one wafer. To insure operational integrity of each integrated circuit die, testing is performed while the circuits are still part of the wafer. In addition, internal voltage regulators and other operational circuitry such as fuses are adjusted while at the wafer level. FIG. 1 illustrates a top view of a typical integrated circuit wafer which is substantially round with one edge flattened or notched for orientation.

To test the integrated circuit die, a probe card is used which includes numerous electrical probes which are positioned during testing so that electrical contact locations provided on an integrated circuit die are accessed. Because each die contains extensive contact locations, sometimes up to one hundred or more locations, probe cards are very complicated and expensive. Further, to reduce the time required to test each integrated circuit die, probe cards are typically designed to probe several die at one time. A trade off is experienced between the cost of building and maintaining a probe card which probes a large number of die at one time, and the number of steps required during testing to physically contact each die on a wafer. At both extremes, a single complicated and expensive probe card could be designed to probe an entire wafer in one step, or a probe card which probes only one die at a time could be used by substantially increasing the number of steps. It is desired, therefore, to design and build probe cards which optimize the number of steps while maintaining an acceptable economic cost.

Currently, multi-die probe cards are designed using a "best guess" technique coupled with hand calculations which are prone to errors. To appreciate the deficiencies of present probe card designs, a brief explanation of a typical probe card design and usage is provided. To design a probe card matrix, numerous factors are taken into account, such as the physical size of each die and the number of probes required per die. As such, the layout of the probe card matrix is designed first. Once the probe card matrix is designed, manual calculations are performed to determine a sequence of steps required to test every die on a wafer. For example, a 2×3 probe card matrix (probes six die at one time) can be moved in numerous ways to cover an entire wafer of die without testing any die twice. Depending upon a wafer layout, a 1×6 or a 3×2 probe card may however require less steps to test an entire wafer.

A poorly designed, or non-optimized, probe card requires unnecessary time to probe a wafer, and thus is more expensive to operate. The time required to test a wafer is influenced by both fixed and variable sources. Each probe card step, or touchdown, requires tester process initiation steps, data recording time, and probe card movement time to move the probe card to different locations on the wafer. Total test time, therefore, can be reduced by minimizing the number of touchdowns for a wafer test. Further, by optimizing a probe card design, parallel operating functions can be exploited. That is, many test functions are run in a parallel mode to reduce overhead time and achieve a maximum utilization of hardware.

A probe card which is improperly designed to test too many die at one time can result in a sacrifice of hardware utilization. Too many sites, or an incorrect layout, result in extra setup and maintenance costs for probe pins that are seldom or never used. Further, incorrect layouts can actually cause more touchdowns than necessary. An increase in overhead time can also be experienced by tracking unused sites.

For the reasons stated above, and for other reasons stated below which will become apparent to those skilled in the art upon reading and understanding the present specification, there is a need in the art for a probe card design method which optimizes the number of die probed per touchdown and minimizes the number of steps required to test a wafer.

SUMMARY OF THE INVENTION

The above-mentioned problems with integrated circuit testers and other problems are addressed by the present invention and which will be understood by reading and studying the following specification. A method is described for determining an optimum probe card matrix design for testing integrated circuit die provided in a wafer.

In particular, the present invention describes a method of selecting a probe card matrix layout for integrated circuit wafer testing. The method comprises the steps of defining a maximum number of test sites in the matrix in both X and Y directions, defining a maximum number of test sites in the matrix, specifying a number of rows in the wafer, and specifying a number of integrated circuits provided in each row of the wafer. The method comprises the step of analyzing the number of rows in the wafer and the number of integrated circuits provided in each row of the wafer to determine a number of touchdowns needed to test each integrated circuit provided in the wafer for a plurality of probe card matrix configurations. Finally, data is provided which indicates a minimum number of touchdowns for each one of the plurality of probe card matrix configurations.

In an alternate embodiment, the method can be executed on a computer and the step of analyzing comprises the sub-steps of selecting a probe card matrix having a width W from one to X, and a height H from one to Y, and selecting a first H rows from the wafer. The longest one of the first H rows is identified and divided by width W, rounding a result up to the nearest integer. The remaining rows of the wafer are separated into sets of H rows, a longest row in each set is divided by W, and rounded up to the nearest integer. The results are summarized to identify a number of touchdowns required to test the integrated circuit wafer using the selected a probe card matrix In yet another embodiment, a method is described for determining a required number of touchdown steps of a plurality of integrated circuit probe card matrixes. For each of a plurality of X×Y matrixes and an integrated circuit wafer having R rows, the method comprises determining a non-offset touchdown total comprising the steps of selecting R/Y sets of the R rows, determining a number of touchdowns required for each one of the R/Y sets, totaling the number of touchdowns required for each one of the R/Y sets to generate the non-offset touchdown total required for the wafer. The method further comprises determining an offset touchdown total comprising the steps of selecting a first set of W rows, wherein W is less than Y, determining a number of touchdowns required for the first set of rows, selecting (R−W)/Y sets from the remaining rows, determining a number of touchdowns required for each one of the (R−W)/Y sets, totaling the number of touchdowns required for the first set and each one of the (R−W)/Y sets to generate the offset touchdown total required for the wafer. Finally an output is provided which indicates both the non-offset touchdown total and the offset touchdown total.

DETAILED DESCRIPTION OF THE INVENTION

In the following detailed description of the preferred embodiments, reference is made to the accompanying drawings which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present inventions. The following detailed description is, therefore, not to be taken in a limiting sense, and the scope of the present invention is defined only by the appended claims.

Figure 1:
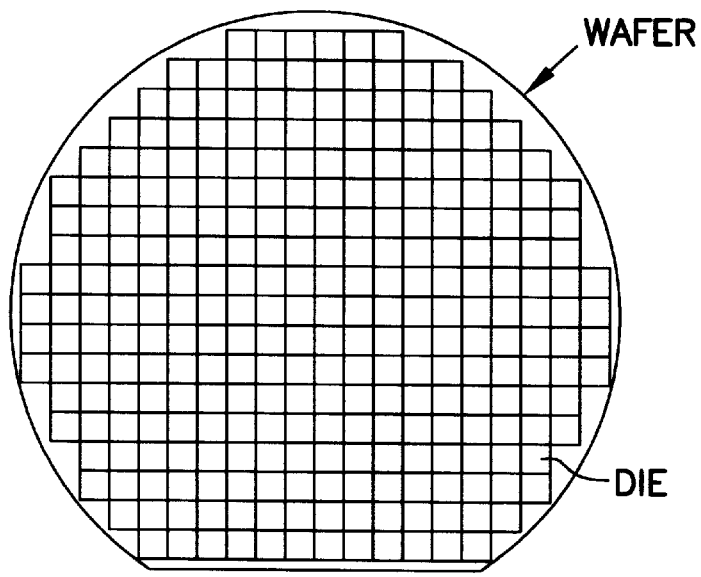
FIG. 1 is an illustration of a prior art integrated circuit wafer.
Figure 2:
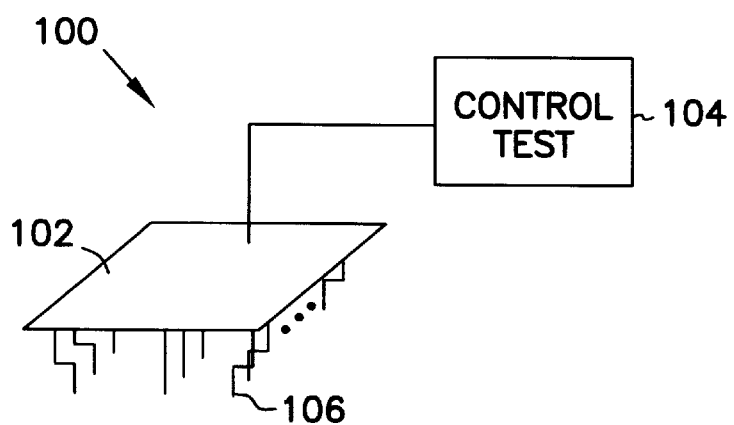
FIG. 2 is a simplified illustration of an integrated circuit probe card and tester.

A simplified illustration of a probe card 100 of an integrated circuit test system is provided in FIG. 2. The probe card includes a circuit board 102 which is coupled to a test controller 104 for conducting testing operations. A plurality of probes 106 extend from the circuit board for contacting electrical probe locations provided on an integrated circuit die. It will be appreciated by those skilled in the art that the probe card illustrated in FIG. 2 has been simplified to illustrate the basic components of a probe card. Because integrated circuits are individually designed and have unique layouts, each probe card is typically custom manufactured for an integrated circuit. Further, the circuit board 102 design is much more complicated than illustrated. Its basic function, however, is to provide support for the probes and electrically couple the probes to the test controller. In the test system each probe card contains a plurality of test sites, made up of test probes arranged in a matrix formation. The number of test sites in both the X and Y directions of the matrix are determined based upon a layout of the wafer to be tested, as described in detail below.

Figure 3:
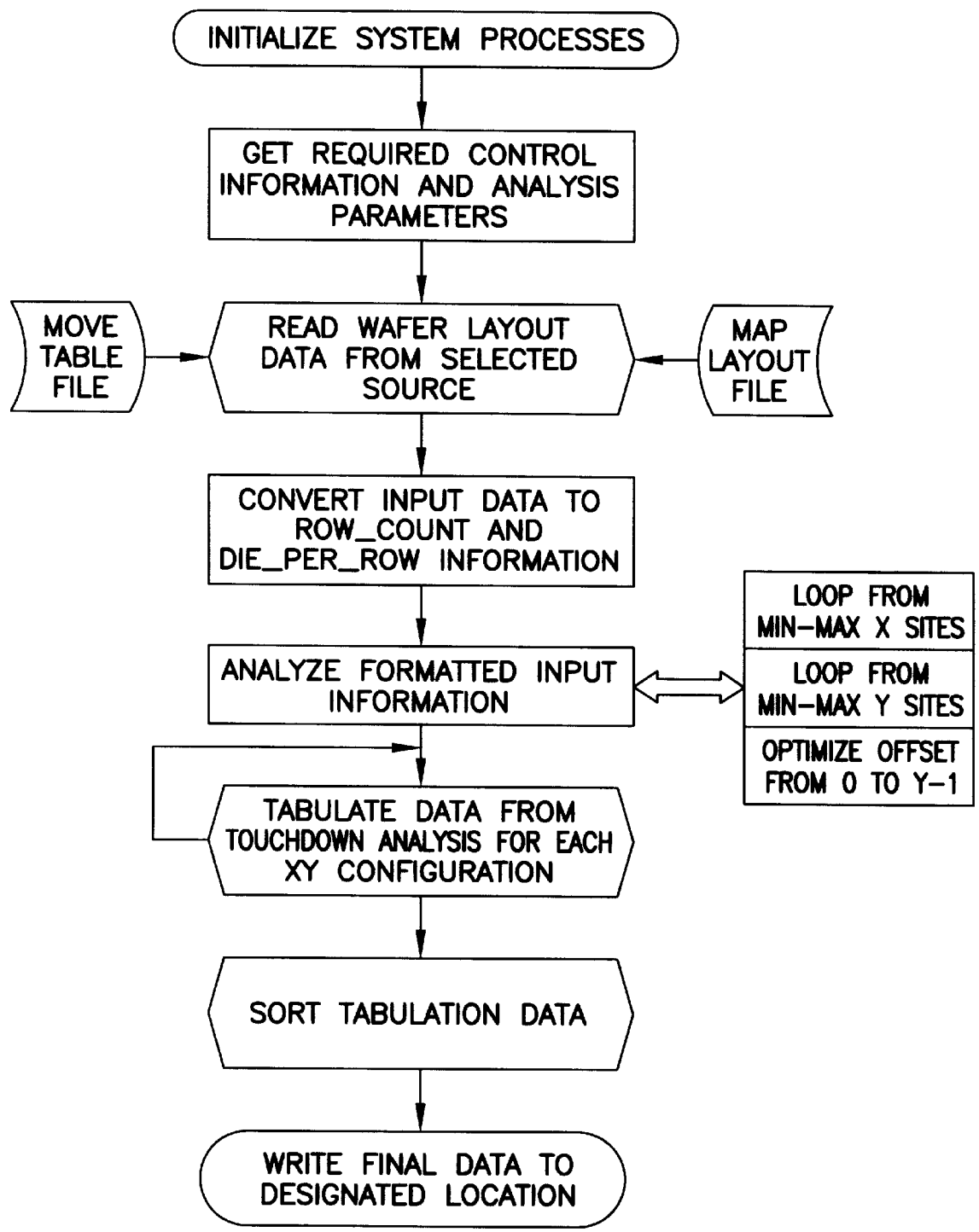
FIG. 3 is a flow diagram of a method of analyzing a wafer for designing a probe card.

Referring to FIG. 3, a probe card design process is illustrated. The process of designing a probe card matrix according to the present invention is preferably performed using a computer-based system performing software instructions which instruct a processor to calculate an optimal number and matrix configuration of probe cards in an integrated circuit test system. The first step in designing a probe card is to define known limitations. Such limitations include minimum and maximum sites (or die) in both the X and Y directions of the matrix, and a maximum number of sites (or die) per matrix. Additional control information can be provided, such as an integrated circuit design identification number and/or part type, a location where input data describing a layout of a wafer to be tested is stored, and an output destination where output data is to be provided. For example, input data may be located on a disk drive, or other memory storage location. Regardless of the type of storage where the data is located, different types of data files can be used. For example, a "Move Table File" or a "Map Layout File" can be used. Additionally, output data may be directed to a storage device, a printer, and/or a display screen.

Figure 4A:
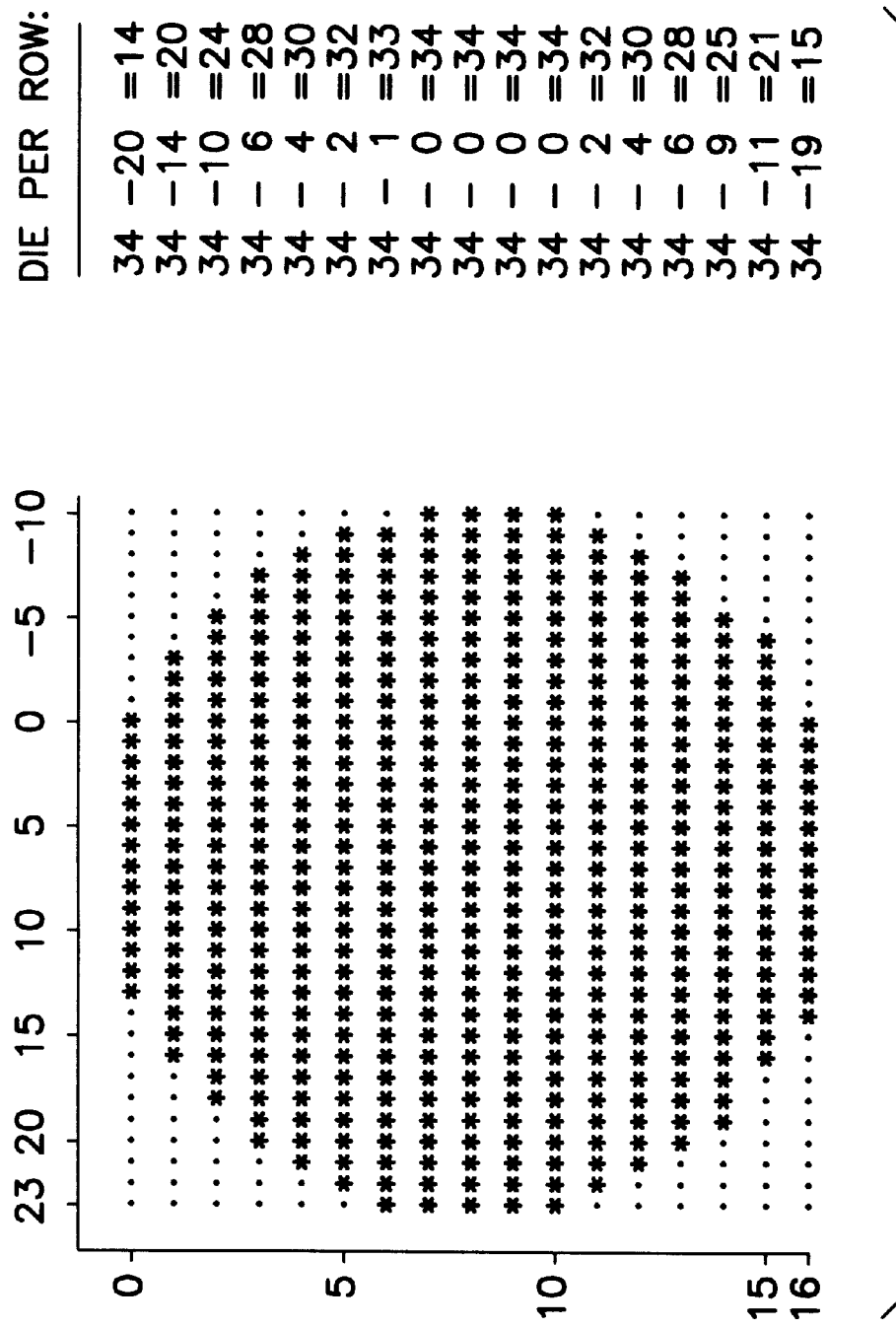
FIG. 4A is an illustration of an integrated circuit wafer.
Figure 4B:
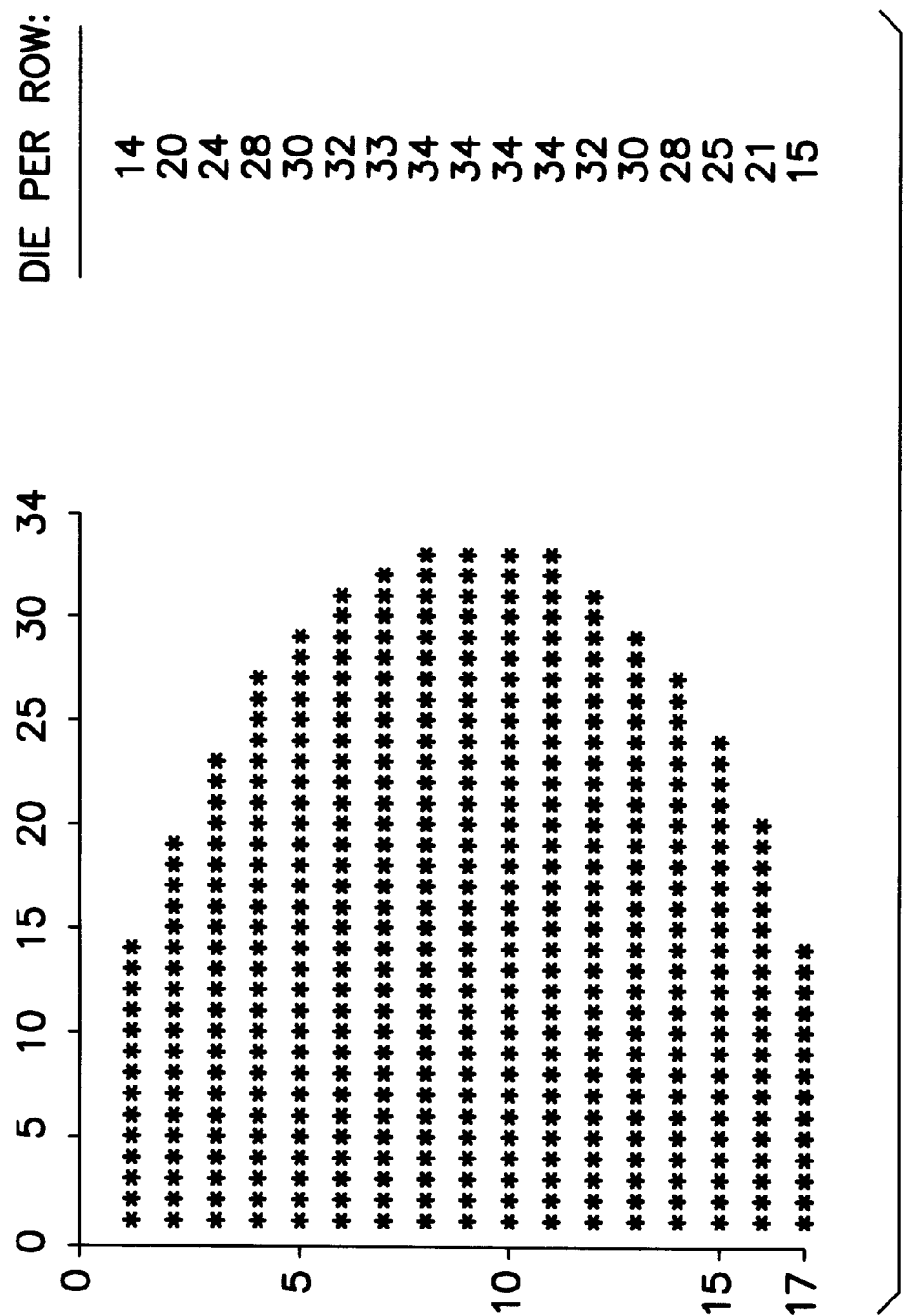
FIG. 4B is an illustration of the integrated circuit wafer of FIG. 4A where each row is justified.

Once control information and analysis parameters have been entered, wafer layout data can be read, or retrieved, from the specified location. The wafer layout data is converted into a Row_Count indicating the number of rows provided on the wafer, and a Die_Per_Row number indicating the number of integrated circuit die provided in each row of the wafer. Referring at this time to FIG. 4A, typical wafer layout input data is illustrated. The wafer data indicates positions in a square grid which contain either integrated circuit die or blank locations. The wafer represented by the data locations of FIG. 4A includes 17 rows of die. The number of die per row is calculated by subtracting the number of blank locations from a total width of the grid. For example, if the grid is 32 locations wide, and row one contains 20 blank locations, 14 integrated circuit die are provided in the first row of the wafer. A more intuitive illustration of this process is provided in FIG. 4B where the die in each row of the wafer are justified to a left margin. As such, extraneous information such as X and Y coordinates, and valid die vs. blank locations can be ignored.

After the input data has been converted, the converted data is analyzed based upon variable test probe card matrix designs as limited by the X and Y constraints provided. Each matrix design, beginning with a 1×1 matrix, is processed to determine the number of touchdowns required to test the entire wafer. For example, a wafer containing 468 die would require 468 touchdowns using a probe card with a single set of probes. If a maximum number of test sites in both the X and Y directions have been specified as 18, and a maximum number of test sites in the matrix have been specified as 18, each possible matrix which does not violate these limitations is tested. An example output is provided in Table 1. As seen in Table 1, the number of test sites in a matrix varies from 1 to 18, and the touchdowns vary from 468 to 32. It will be appreciated by studying Table 1 that the matrix configuration can have a direct impact on the number of touchdowns required to test a wafer. For example, a 2×3 probe card matrix requires 89 touchdowns to test the wafer, while a 3×2 probe card matrix requires 87 touchdowns. Probe card offsets will be explained below.

TABLE 1

| # of Test Sites | matrix Size X × Y | min. Steps | Y Offset | Total Steps | Probe Card Dimensions (in mils) |
|---|---|---|---|---|---|
| 18 | 6 × 3 | 32 | 0 | 32 | 2466 × 651 |
| 18 | 9 × 2 | 32 | 0 | 32 | 3699 × 434 |
| 18 | 3 × 6 | 32 | 1 | 33 | 1233 × 1302 |
| 18 | 2 × 9 | 33 | 0 | 33 | 822 × 1953 |
| 18 | 1 × 18 | 34 | 0 | 34 | 411 × 3906 |
| 18 | 18 × 1 | 34 | 0 | 34 | 7398 × 217 |
| 17 | 1 × 17 | 34 | 0 | 34 | 411 × 3689 |
| 17 | 17 × 1 | 34 | 0 | 34 | 6987 × 217 |
| 15 | 3 × 5 | 36 | 0 | 36 | 1233 × 1085 |
| 16 | 4 × 4 | 37 | 0 | 37 | 1644 × 868 |
| 16 | 2 × 8 | 38 | 0 | 38 | 822 × 1736 |
| 15 | 5 × 3 | 38 | 2 | 39 | 2055 × 651 |
| 16 | 8 × 2 | 39 | 0 | 39 | 3288 × 434 |
| 16 | 1 × 16 | 41 | 0 | 41 | 411 × 3472 |
| 14 | 2 × 7 | 41 | 0 | 41 | 822 × 1519 |
| 14 | 7 × 2 | 43 | 0 | 43 | 2877 × 434 |
| 15 | 1 × 15 | 45 | 0 | 45 | 411 × 3255 |
| 12 | 3 × 4 | 46 | 1 | 47 | 1233 × 868 |
| 12 | 6 × 2 | 46 | 1 | 47 | 2466 × 434 |
| 14 | 1 × 14 | 47 | 0 | 547 | 411 × 3038 |
| 16 | 16 × 1 | 48 | 0 | 48 | 6576 × 217 |
| 12 | 2 × 6 | 48 | 0 | 48 | 822 × 1302 |
| 12 | 4 × 3 | 48 | 1 | 49 | 1644 × 651 |
| 15 | 15 × 1 | 49 | 0 | 49 | 6165 × 217 |
| 13 | 1 × 13 | 49 | 0 | 49 | 411 × 2821 |
| 12 | 1 × 12 | 49 | 2 | 50 | 411 × 2604 |
| 14 | 14 × 1 | 54 | 0 | 54 | 5754 × 217 |
| 13 | 13 × 1 | 55 | 0 | 55 | 5343 × 217 |
| 11 | 1 × 11 | 55 | 10 | 56 | 411 × 2387 |
| 10 | 2 × 5 | 55 | 0 | 55 | 822 × 1085 |
| 10 | 5 × 2 | 56 | 1 | 57 | 2055 × 434 |
| 12 | 12 × 1 | 58 | 0 | 55 | 4932 × 217 |
| 11 | 11 × 1 | 59 | 0 | 59 | 4521 × 217 |
| 9 | 3 × 3 | 59 | 2 | 60 | 1233 × 651 |
| 10 | 1 × 10 | 60 | 0 | 60 | 411 × 2170 |
| 10 | 10 × 1 | 62 | 0 | 62 | 4110 × 217 |
| 9 | 9 × 1 | 62 | 0 | 62 | 3699 × 217 |
| 9 | 1 × 9 | 62 | 2 | 63 | 411 × 1953 |
| 8 | 2 × 4 | 69 | 0 | 69 | 822 × 868 |
| 8 | 4 × 2 | 69 | 0 | 69 | 1644 × 434 |
| 8 | 1 × 8 | 71 | 6 | 72 | 411 × 1736 |
| 7 | 1 × 7 | 77 | 0 | 77 | 411 × 1519 |
| 8 | 8 × 1 | 78 | 0 | 78 | 3288 × 217 |
| 7 | 7 × 1 | 84 | 0 | 84 | 2877 × 217 |
| 6 | 3 × 2 | 86 | 1 | 87 | 1233 × 434 |
| 6 | 2 × 3 | 88 | 2 | 89 | 822 × 651 |
| 6 | 6 × 1 | 90 | 0 | 90 | 2466 × 217 |
| 6 | 1 × 6 | 90 | 2 | 91 | 411 × 1302 |
| 5 | 1 × 5 | 103 | 0 | 103 | 411 × 1085 |
| 5 | 5 × 1 | 109 | 0 | 109 | 2055 × 217 |
| 4 | 2 × 2 | 129 | 0 | 129 | 822 × 434 |
| 4 | 1 × 4 | 129 | 2 | 130 | 411 × 868 |
| 4 | 4 × 1 | 135 | 0 | 135 | 1644 × 217 |
| 3 | 1 × 3 | 165 | 2 | 168 | 411 × 651 |
| 3 | 3 × 1 | 167 | 0 | 167 | 1233 × 217 |
| 2 | 1 × 2 | 242 | 0 | 242 | 411 × 434 |
| 2 | 2 × 1 | 249 | 0 | 249 | 822 × 217 |
| 1 | 1 × 1 | 468 | 0 | 468 | 411 × 217 |

During the step of analysis, the processor determines the maximum number of die in any row which will be probed by the probe card matrix being analyzed. This maximum number of die is then divided by the number of probe card sites in the X direction. The process of analyzing a 3×2 probe card includes the following steps. The number of rows R in the wafer are divided into R/2 sets. For different matrix configurations, a last set of rows may contain less than two rows. The first set included rows 1 and 2. Rows 1 in 2 are compared to determine which comprises more die, the longest row is divided by X-columns (3) and rounded up. For example, if row two is a larger than row one (20>14) the minimum touchdowns equal 7 (20/3). This count is then added to a total touchdown count. Data for the next two rows are analyzed in the same manner. These steps are repeated for all probe card matrix configurations being considered. This process, however, can be modified to provide for offsets of the probe cards during testing.

Figure 5A:
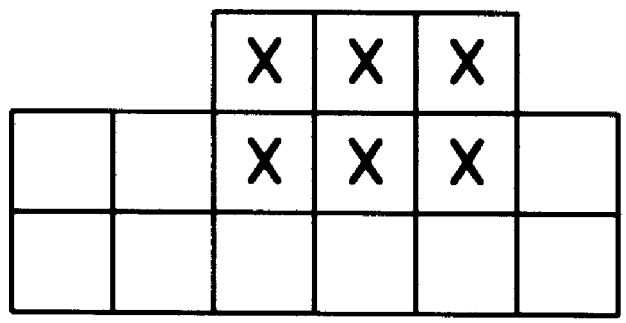
FIG. 5A is an illustration of a non-offset touchdown test sequence.
Figure 5B:
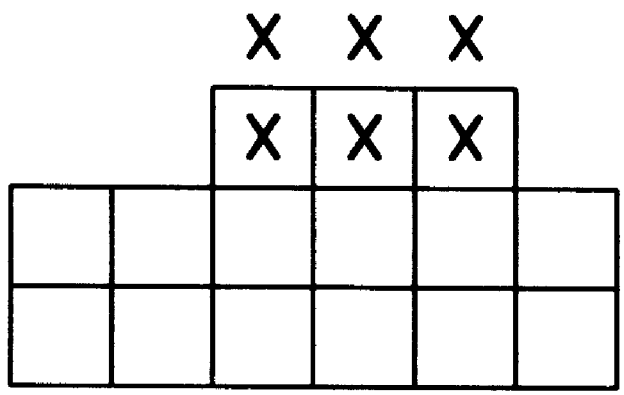
FIG. 5B is an illustration of an offset touchdown test sequence.

Referring to FIGS. 5A and 5B, the concept of offsetting probe cards during testing of the wafer is explained. Typically, probe cards are placed on a wafer during testing such that a first die of a first row corresponds to a first row of test sites on a probe card as illustrated in FIG. 5A (as illustrated by the x's). The first row and three die in row two are tested using a 3×2 probe card on a first touchdown. To test the remaining nine die, three additional touchdowns are required. It is again noted that re-testing a die is prohibited. If the probe card can be offset in the Y direction on the first touchdown, the number of touchdowns required to test an entire wafer can be reduced. The same 15 die of FIG. 5A can be tested using three touchdowns by offsetting the probe card matrix one row in the Y direction, as illustrated in FIG. 5B. That is, the first set of rows of the wafer which is probed is less than the height of the matrix. The allowable offset is limited by the probe card configuration. For example, a 3×2 probe card matrix can only utilize a one row (y−1) offset. In contrast, a 8×4 probe card matrix can be offset from 1 to 3 rows, and a 4×8 probe card matrix could be offset up to 7 rows. In any case, only the first step is offset and can reduce the total number of touchdowns required per wafer.

After the input information has been analyzed and tabulated for each X–Y configuration, the data can be sorted according to predefined criteria. Such criteria, typically, include sorting the data from minimum to maximum touchdowns, low to high test site counts, and physical probe card span. Although the use of a minimum number of test sites per probe card matrix may seem contrary to the desire for high parallelism, if the same minimum touchdown steps can be achieved with less hardware, overall production expenses will be reduced. Further, it is often desired to minimize the difference between the physical dimensions of the probe cards. That is, a square matrix is preferred to a highly rectangular configuration. Once the analyzed data has been tabulated and sorted, the output can be written to the desired destination location.

Hardware Environment

Figure 6:
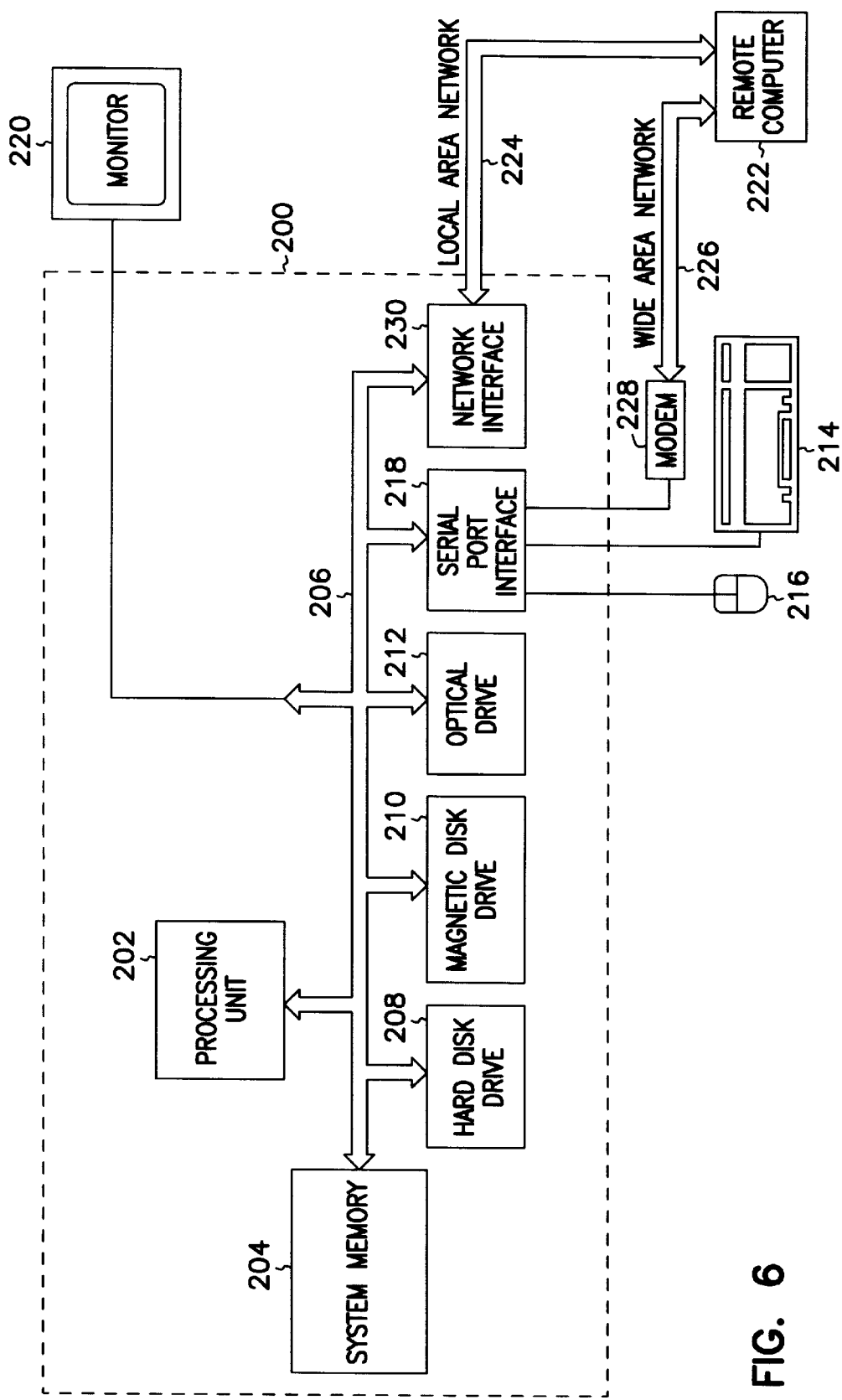
FIG. 6 is a diagram of the hardware and operating environment in which embodiments of the invention may be practiced.

Referring to FIG. 6, a diagram of the hardware environment in conjunction with which embodiments of the invention may be practiced is shown. The description of FIG. 6 is intended to provide a brief, general description of suitable computer hardware and a suitable computing environment in conjunction with which the invention may be implemented. Although not required, the invention is described in the general context of computer-executable instructions, such as program modules, being executed by a computer, such as a personal computer. Generally, program modules include routines, programs, objects, components, data structures, etc., that perform particular tasks or implement particular abstract data types.

Moreover, those skilled in the art will appreciate that the invention may be practiced with other computer system configurations, including multiprocessor systems, microprocessor-based, network computers, mainframe computers, and the like. The invention may also be practiced in distributed computing environments where tasks are performed by remote processing devices that are linked through a communications network. In a distributed computing environment, program modules may be located in both local and remote memory storage devices.

One general embodiment of hardware environment of FIG. 6 for implementing the invention includes a general purpose computing device in the form of a computer 200, including a processing unit 202, a system memory 204, and a system bus 206 that operatively couples various system components include the system memory to the processing unit. There may be only one or there may be more than one processing unit, such that the processor of computer 200 comprises a single central-processing unit (CPU), or a plurality of processing units, commonly referred to as a parallel processing environment.

The system bus may be any of several types of bus structures including a memory bus or memory controller, a peripheral bus, and a local bus using any of a variety of bus architectures. The system memory may include read only memory (ROM) and random access memory (RAM). The computer can further include a hard disk drive 208 for reading from and writing to a hard disk, a magnetic disk drive 210 for reading from or writing to a removable magnetic disk, and an optical disk drive 212 for reading from or writing to a removable optical disk such as a CD ROM or other optical media. The drives and their associated computer-readable media provide nonvolatile storage of computer-readable instructions, data structures, program modules and other data for the computer. It should be appreciated by those skilled in the art that any type of computer-readable media which can store data that is accessible by a computer, such as magnetic cassettes, flash memory cards, digital video disks, random access memories (RAMs), read only memories (ROMs), may be used.

A user may enter commands and information into the computer through input devices such as a keyboard 214 and pointing device 216. These and other input devices are often connected to the processing unit 202 through a serial port interface 218 that is coupled to the system bus, but may be connected by other interfaces, such as a parallel port, or a universal serial bus (USB). A monitor 220 or other type of display device is also connected to the system bus.

The computer may operate in a networked environment using logical connections to one or more remote computers, such as remote computer 222. These logical connections are achieved by a communication device coupled to or a part of the computer. The remote computer may be another computer, a server, a router, a network PC, a client, a peer device or other common network node, and typically includes many or all of the elements described above relative to the computer. The logical connections depicted in FIG. 6 include a local-area network (LAN) 224 and a wide-area network (WAN) 226.

When used in a LAN-networking environment, the computer is connected to the local network through a network interface or adapter, which is one type of communications device. When used in a WAN-networking environment, the computer typically includes a modem 228, a type of communications device, or any other type of communications device for establishing communications over the wide area network.

Integrated Circuit Memory Die

Figure 7:
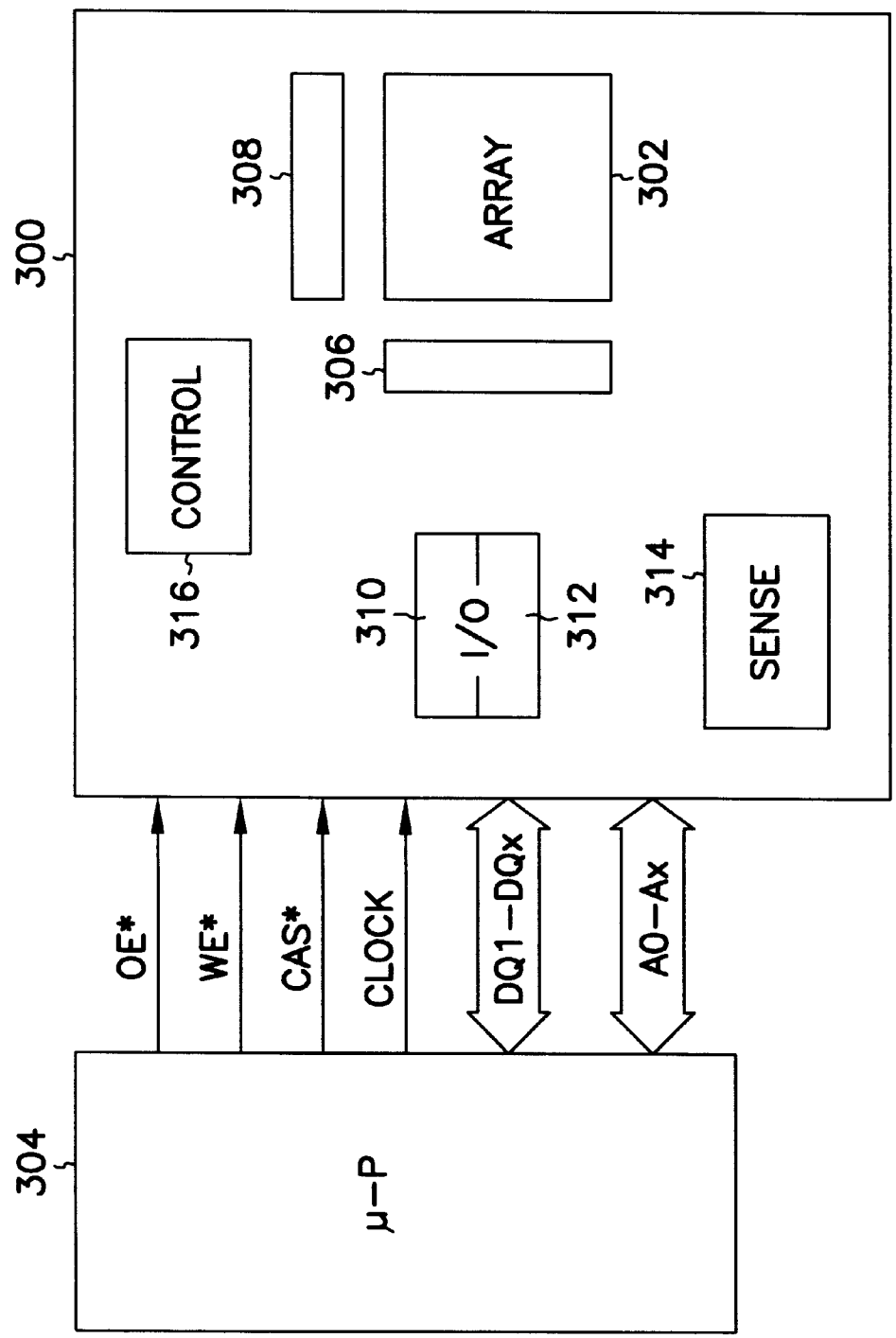
FIG. 7 is a general illustration of an integrated circuit memory which can be embodied on a wafer.

The present invention is applicable to any integrated circuit, and can be implemented in designing a probe card matrix for testing memory devices such as a dynamic random access memory (DRAM). A DRAM 300 is described in reference to FIG. 7 as having a memory array 302 and associated circuitry for reading from and writing to the memory array. The memory array is arranged in an x–y grid, or rows and columns of memory cells. The DRAM array can be accessed by a microprocessor 304, memory controller, a chip set, or other external system through input/output connections including address lines A0-Ax. Row decoder 306 decodes a row address from an address signal provided on A0-Ax, and addresses the corresponding row of the DRAM array. Likewise, column decoder 308 decodes a column address from an address signal provided on A0-Ax, and addresses the corresponding column of the DRAM array. Data stored in the DRAM array can be transferred to outputs DQ1-DQx through the data output buffer 310. Likewise, data input buffer 312 is used to receive data from DQ1-DQx and transfer the data to the DRAM array. Sense amplifier circuitry 314 is provided to sense and amplify data stored on the individual memory cells of the DRAM array. Control circuitry 316 is provided to monitor the memory circuit inputs and control reading and writing operations.

The input and output connections of the DRAM 300 used to communicate with the microprocessor 304 are described as follows. Output enable (OE*) enables the output buffer 310 of the DRAM. Write enable (WE*) is used to select either a read or write operation when accessing the DRAM. Row address strobe (RAS*) input is used to clock in the eleven row address bits. Column address strobe (CAS*) input is used to clock in the ten column address bits. Address input lines A0-Ax are used to identify a row and column address. DRAM data input/output lines DQ1-DQx provide data input and output for the DRAM. An optional clock signal can be provided by the microprocessor for operating the memory circuit in a synchronous mode.

It will be understood that the above description of a DRAM is intended to provide a general understanding of the memory and is not a complete description of all the elements and features of a DRAM. Further, the present invention is equally applicable to any size and type of memory circuit and is not intended to be limited to the DRAM described above.

Conclusion

A probe card design method has been described which optimizes the number of die probed per touchdown and minimizes the number of steps required to test an integrated circuit wafer. The method analyses rows of a wafer in sets. Assuming a specific probe card matrix, the number of steps required for each set is determined and a total number of steps required for the wafer is determined. This method is repeated for a plurality of probe card matrixes. The size of the first set can be varied to determine an optimum offset to reduce the number of steps required to test the wafer. The sets are analyzed by dividing the longest row of the set by the width of the matrix, rounding a result up to the nearest integer. The result of each set is summarized to indicate a minimum number of touchdowns required to test a wafer. A probe card matrix design can be selected based upon the minimum number of touchdowns, number of test sites in a matrix, and a physical size of the matrixes.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. A method of selecting a probe card matrix layout for integrated circuit wafer testing, the method comprising:

defining a maximum number of test sites in the probe card matrix in both X and Y directions;

defining a maximum number of test sites in the probe card matrix;

specifying a number of rows in the wafer;

specifying a number of integrated circuits provided in each row of the wafer;

analyzing the number of rows in the wafer and the number of integrated circuits provided in each row of the wafer to determine a number of touchdowns needed to test each integrated circuit provided in the wafer for a plurality of probe card matrix configurations, wherein analyzing comprises:

selecting a probe card matrix having a width W from one to X, and a height H from one to Y;

selecting a first H rows from the wafer;

identifying a longest one of the first H rows which contain the most integrated circuit die;

dividing the longest one of the first H rows by width W, rounding a result up to the nearest integer;

selecting remaining rows of the wafer in sets of H rows, identifying a longest row in each set, dividing the longest rows by W, and rounding a result up to the nearest integer; and summing the results to identify a number of touchdowns required to test the integrated circuit wafer;

providing data indicating a minimum number of touchdowns for each one of the plurality of probe card matrix configurations; and designing an integrated circuit probe card using the provided data.

2. The method of claim 1 wherein the method is performed using a computer executing provided instructions.

3. The method of claim 1 wherein analyzing comprises:

selecting a probe card matrix having a width W from one to X, and a height H from one to Y;

selecting a first H rows from the wafer;

identifying a longest one of the first H rows which contain the most integrated circuit die;

dividing the longest one of the first H rows by width W, rounding a result up to the nearest integer;

selecting remaining rows of the wafer in sets of H rows, identifying a longest row in each set, dividing the longest rows by W, and rounding a result up to the nearest integer; and summing the results to identify a number of touchdowns required to test the integrated circuit wafer.

4. The method of claim 1 further comprising:

providing an output identifying the number of touchdowns required to test the integrated circuit wafer for a series of probe card matrixes having a width W ranging from one to X, a height H ranging from one to Y, and a total number of test sites which is less than or equal to a predefined maximum value.

5. The method of claim 1 further comprising:

determining if the number of touchdowns required to test the integrated circuit wafer can be reduced by selecting less than a first H rows from the wafer.

6. The method of claim 1 further comprising:

providing data indicating a physical size for each one of the plurality of probe card matrix configurations.

7. The method of claim 6 further comprising:

selecting one of the plurality of probe card matrix configurations requiring a minimum number of touchdowns, and having a substantially square physical size.

8. The method of claim 1 further comprising:

selecting one of the plurality of probe card matrix configurations requiring a minimum number of touchdowns.

9. The method of claim 1 further comprising:

selecting one of the plurality of probe card matrix configurations requiring a minimum number of touchdowns, and having a minimum number of test sites in the probe card matrix.

10. A computerized method for selecting a probe card matrix layout for integrated circuit wafer testing, the method comprising:

inputting a maximum number of test sites in the probe card matrix in both X and Y directions;

inputting a maximum number of test sites in the probe card matrix;

inputting a number of rows in the wafer, and a number of integrated circuits provided in each row of the wafer;

using a computer, analyzing the number of rows in the wafer and the number of integrated circuits provided in each row of the wafer to determine a number of touchdowns needed to test each integrated circuit provided in the wafer for a plurality of probe card matrix configurations, analyzing comprises:

selecting a probe card matrix having a width W from one to X, and a height H from one to Y;

selecting a first H rows from the wafer;

identifying a longest one of the first H rows which contain the most integrated circuit die;

dividing the longest one of the first H rows by width W, rounding a result up to the nearest integer;

selecting remaining rows of the wafer in sets of H rows, identifying a longest row in each set, dividing the longest rows by W, and rounding a result up to the nearest integer; and summing the results to identify a number of touchdowns required to test the integrated circuit wafer using the selected a probe card matrix;

providing output data indicating a minimum number of touchdowns for each one of the plurality of probe card matrix configurations; and designing an integrated circuit probe card using the provided data.

11. The computerized method of claim 10 further comprising:

providing output data indicating a physical size for each one of the plurality of probe card matrix configurations.

12. The computerized method of claim 11 further comprising:

selecting one of the plurality of probe card matrix configurations requiring a minimum number of touchdowns, and having a substantially square physical size.

13. The computerized method of claim 10 further comprising:

selecting one of the plurality of probe card matrix configurations requiring a minimum number of touchdowns.

14. The computerized method of claim 10 further comprising:
selecting one of the plurality of probe card matrix configurations requiring a minimum number of touchdowns, and having a minimum number of test sites in the probe card matrix.

15. A method of determining a required number of touchdown steps of a plurality of integrated circuit probe card matrixes, for each of a plurality of X×Y matrixes and an integrated circuit wafer having R rows the method comprises:
determining a non-offset touchdown total comprising selecting R/Y sets of the R rows, determining a number of touchdowns required for each one of the R/Y sets by dividing a longest row of each one of the R/Y sets by X and rounding to the nearest integer to indicate a number of touchdowns required for each one of the R/Y sets, totaling the number of touchdowns required for each one of the R/Y sets to generate the non-offset touchdown total required for the wafer;

determining an offset touchdown total comprising selecting a first set of W rows, wherein W is less than Y, determining a number of touchdowns required for the first set of rows, selecting (R−W)/Y sets from the remaining rows, determining a number of touchdowns required for each one of the (R−W)/Y sets, totaling the number of touchdowns required for the first set and each one of the (R−W)/Y sets to generate the offset touchdown total required for the wafer;

providing an output indicating both the non-offset touchdown total and the offset touchdown total; and designing the integrated circuit probe card using the provided output.

* * * * *